United States Patent
Mitsuhashi et al.

(10) Patent No.: US 9,502,159 B2
(45) Date of Patent: Nov. 22, 2016

(54) SUPERCONDUCTING WIRE CONNECTION STRUCTURE, SUPERCONDUCTING WIRE CONNECTION METHOD, AND CONNECTION SUPERCONDUCTING WIRE

(71) Applicants: FURUKAWA ELECTRIC CO., LTD., Tokyo (JP); INTERNATIONAL SUPERCONDUCTIVITY TECHNOLOGY CENTER, Kanagawa (JP)

(72) Inventors: Takaharu Mitsuhashi, Tokyo (JP); Masashi Yagi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/235,025

(22) PCT Filed: Feb. 6, 2013

(86) PCT No.: PCT/JP2013/052734
§ 371 (c)(1),
(2) Date: Jan. 24, 2014

(87) PCT Pub. No.: WO2013/164918
PCT Pub. Date: Nov. 7, 2013

(65) Prior Publication Data
US 2015/0045229 A1    Feb. 12, 2015

(30) Foreign Application Priority Data
May 2, 2012    (JP) .................... 2012-105013

(51) Int. Cl.
*H01L 39/24*     (2006.01)
*H01B 12/02*     (2006.01)
(Continued)

(52) U.S. Cl.
CPC ............. *H01B 12/02* (2013.01); *H01L 39/02* (2013.01); *H01L 39/2422* (2013.01); *H02G 15/34* (2013.01); *H01R 4/68* (2013.01); *Y02E 40/648* (2013.01); *Y10T 29/49014* (2015.01)

(58) Field of Classification Search
CPC ................................ H01B 12/02; H02G 15/34
USPC ........................................................ 505/230
See application file for complete search history.

(56) References Cited

U.S. PATENT DOCUMENTS 5,358,929 A * 10/1994 Fujikami et al. ............. 505/100
2006/0040830 A1 * 2/2006 Thieme et al. ............... 505/231
(Continued)

FOREIGN PATENT DOCUMENTS

CN    1455934 A1    11/2003
CN    102105947 A    6/2011
(Continued)

OTHER PUBLICATIONS

International Preliminary Report on Patentability for PCT Application Serial No. PCT/JP2013/052734, mailed Nov. 4, 2014, 13 pages.
(Continued)

*Primary Examiner* — Paul Wartalowicz
(74) *Attorney, Agent, or Firm* — Amin, Turocy & Watson, LLP

(57) ABSTRACT

A superconducting wire connection structure comprises a first superconducting wire and a second superconducting wire, ends of which are arranged across from each other, and a third superconducting wire which spans and connects the first superconducting wire and the second superconducting wire along a longitudinal direction of the first superconducting wire and the second superconducting wire. Each of the first superconducting wire, the second superconducting wire and the third superconducting wire is a tape-shaped superconducting wire which includes a substrate laminated with at least a superconductive layer. The third wire is narrower in at least one portion than the first superconducting wire and the second superconducting wire.

10 Claims, 4 Drawing Sheets

(51) Int. Cl.
*H02G 15/34* (2006.01)
*H01L 39/02* (2006.01)
*H01R 4/68* (2006.01)

(56) References Cited

U.S. PATENT DOCUMENTS

| | | | |
|---|---|---|---|
| 2008/0108506 A1* | 5/2008 | Kraemer et al. | 505/237 |
| 2009/0298696 A1* | 12/2009 | Otto et al. | 505/230 |
| 2010/0022396 A1 | 1/2010 | Otto et al. | |
| 2012/0065074 A1 | 3/2012 | Xie et al. | |

FOREIGN PATENT DOCUMENTS

| | | |
|---|---|---|
| EP | 0556837 A1 | 8/1993 |
| EP | 0634379 | 1/1995 |
| JP | H08203652 | 8/1996 |
| JP | 2000133067 | 5/2000 |
| JP | 2002289049 | 10/2002 |
| JP | 3717638 | 11/2005 |
| JP | 3836299 | 10/2006 |
| JP | 2008-234957 | 10/2008 |
| JP | 4182832 | 11/2008 |
| JP | 2009187743 | 8/2009 |
| JP | 2011-154790 A | 8/2011 |
| JP | 2011154790 A | 8/2011 |
| JP | 2011238509 | 11/2011 |
| JP | 2011238510 | 11/2011 |
| WO | 0133580 | 5/2001 |
| WO | 2012037231 | 3/2012 |

OTHER PUBLICATIONS

International Search Report for PCT Application Serial No. PCT/JP2013/052734, mailed Mar. 19, 2013, 4 pages.
European Search Report dated Apr. 30, 2015 for European Application Serial No. 13784838.8, 5 pages.
Extended European Search Report dated Aug. 21, 2015 for European Application Serial No. 13784838.8, 8 pages.
Chinese Office Action mailed Oct. 26, 2015 for Chinese Application No. 201380002246.6, 21 pages (with translation).
Chinese Office Action dated Jun. 12, 2016 for Chinese Application Serial No. 201380002246.6, 15 pages (including English translation).
Japanese Office Action dated Sep. 13, 2016 for Japanese Application Serial No. 2014-513340, 10 pages (including English translation).

* cited by examiner

SUPERCONDUCTING WIRE CONNECTION STRUCTURE, SUPERCONDUCTING WIRE CONNECTION METHOD, AND CONNECTION SUPERCONDUCTING WIRE

CROSS-REFERENCE TO RELATED APPLICATIONS

This application is a U.S. National Stage application of, and claims priority to, PCT Patent Application No. PCT/JP2013/052734, filed Feb. 6, 2013 and entitled "SUPERCONDUCTING WIRE CONNECTION STRUCTURE, SUPERCONDUCTING WIRE CONNECTION METHOD, AND SUPERCONDUCTING WIRE FOR CONNECTING"; which claims priority to Japanese Patent Application No. 2012-105013, filed May 2, 2012. The entireties of the above-referenced applications are incorporated herein by reference.

TECHNICAL FIELD

The present invention relates to a superconducting wire connection structure, a superconducting wire connection method and a superconducting wire for connecting.

BACKGROUND ART

Conventionally, in order to connect superconducting wires, electrical connection has been carried out as follows. For example, as shown in FIG. 8A, FIG. 8B and FIG. 8C, a superconducting wire 100 which is cut in a short length for connecting is joined to a portion where ends of superconducting wires 10 abut on each other by soldering or spot welding such that the superconducting wire 100 and the superconducting wires 10 are stuck together.

Such connection structure is also disclosed in Patent Document 1 for example (see FIG. 3 in Patent Document 1).

Also, it is known that a superconducting film is deposited on a portion where ends of superconducting wires abut on each other (see Patent Documents 2 and 3 for example). It is also known that a connection superconducting wire is stuck to a portion of a superconducting wire where a surface metal layer is removed and then the connection superconducting wire is covered with the surface metal layer which was once removed. Thereby the connection superconducting wire is joined to the superconducting wire (see Patent Document 4 for example).

PRIOR ART DOCUMENT

Patent Document

Patent Document 1: Japanese Patent No. 3717638
Patent Document 2: Japanese Patent No. 3836299
Patent Document 3: Japanese Patent No. 4182832
Patent Document 4: Japanese Patent Publication No. 2008-234957

DISCLOSURE OF THE INVENTION

Problem to be Solved by the Invention

However, as shown in FIG. 8B and FIG. 8C, the connection structures according to the above prior arts and Patent Document 1 have a problem that current flow concentration is caused by the skin effect around ends of the connection superconducting wire 100 (portions enclosed with dotted lines in the figures). A rise in current density can cause heat, and the heat makes the superconducting layer of the superconducting wire deteriorate and thereby superconductivity is lowered.

The connection methods in the above Patent Documents 2 and 3 are not practical because it is hard to bring a deposition apparatus to a work site when the methods are adopted to an applied apparatus (for example, laying of a superconducting wire).

The connection method in the above Patent Document 4 can be adopted to a superconducting wire having a surface metal layer which can be removed, such as a copper tape. However, the method cannot be adopted to a superconducting wire having a surface metal layer which cannot be removed, such as the one formed by plating with copper. Further, superconductivity may be lowered by removal of the surface metal layer which was once formed.

It is an object of the present invention to provide a superconducting wire connection structure, a superconducting wire connection method and a superconducting wire for connecting which make connecting easy and which achieve a stable superconductivity.

Means for Solving the Problem

In order to solve the problems mentioned above, according to the invention of claim 1, a superconducting wire connection structure comprises:

a first superconducting wire and a second superconducting wire, ends of which are arranged across from each other; and a third superconducting wire which spans and connects the first superconducting wire and the second superconducting wire along a longitudinal direction of the first superconducting wire and the second superconducting wire;

wherein each of the first superconducting wire, the second superconducting wire and the third superconducting wire is a tape-shaped superconducting wire which includes a substrate laminated with at least a superconductive layer, wherein a surface of the third superconducting wire on a side where the substrate is laminated with the superconductive layer faces surfaces of the first superconducting wire and the second superconducting wire on a side where the substrates are laminated with the superconductive layers, and wherein the third superconducting wire is narrower in at least one portion than the first superconducting wire and the second superconducting wire.

The invention of claim 2 is the superconducting wire connection structure according to claim 1, wherein the third superconducting wire tapers toward both ends thereof.

The invention of claim 3 is the superconducting wire connection structure according to claim 1 or 2, wherein the first superconducting wire and the second superconducting wire are spaced apart from and arranged across from each other.

The invention of claim 4 is the superconducting wire connection structure according to any one of claims 1 to 3, wherein the third superconducting wire is widest at a portion corresponding to a space between the first superconducting wire and the second superconducting wire.

The invention of claim 5 is a superconducting wire connection method for connecting tape-shaped superconducting wires each of which includes a substrate laminated with at least a superconductive layer, comprising:

spanning and connecting the first superconducting wire and the second superconducting wire by a third superconducting wire along a longitudinal direction of the first superconducting wire and the second superconducting wire at a portion where ends of the first superconducting wire and the second superconducting wire are spaced apart from and arranged across from each other, the third superconducting wire having a portion narrower than each width of the first superconducting wire and the second superconducting wire.

The invention of claim 6 is a superconducting wire connection method, comprising:

spanning and connecting a first area and a second area of a superconducting wire facing each other across a deterioration area by a connection superconducting wire at a portion where the first area and the second area are arranged across from each other, the deterioration area being electrically deteriorated, and the connection superconducting wire having a portion narrower than a width of the superconducting wire.

The invention of claim 7 is a connection superconducting wire for electrically connecting a first superconducting wire and a second superconducting wire, ends of which are arranged across from each other, comprising:

a center portion in a longitudinal direction of the connection superconducting wire which is a widest portion of the connection superconducting wire, wherein the connection superconducting wire narrows toward ends from the center portion.

The invention of claim 8 is the connection superconducting wire according to claim 7, wherein the connection superconducting wire has a laminated structure including a superconducting layer, sides of which are covered with an electric conductor.

Advantageous Effect of the Invention

According to the present invention, superconducting wires can be easily connected so that stable superconductivity is achieved.

EMBODIMENT FOR CARRYING OUT THE INVENTION

In the following, preferable modes for carrying out the present invention will be described with reference to the accompanying drawings. Although technically preferable various limitations are added to the embodiments described below in order to carry out the present invention, the scope of the invention is not limited to the following embodiments and shown examples.

Figure 1:
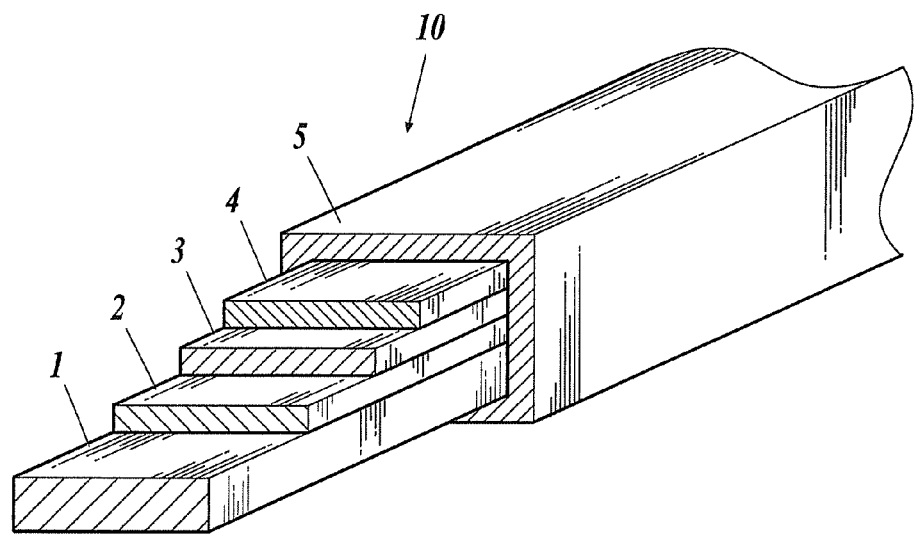
FIG. 1 This is a figure showing a layer configuration of a superconducting wire.

FIG. 1 is a figure showing a layer configuration of a superconducting wire.

The superconducting wire 10 is, for example, a tape-shaped superconducting wire provided with a laminated body and a stabilization layer 5 which surrounds and covers the laminated body as shown in FIG. 1. The laminated body includes a middle layer 2, a superconducting layer 3 and a protection layer 4 that are piled up in this order on a substrate 1.

The substrate 1 is, for example, a tape-shaped metal substrate made from low-magnetic and non-oriented metal such as hastelloy (registered trademark).

The middle layer 2 is a layer formed for achieving high in-plane orientation of the superconducting layer 3.

The superconducting layer 3 is, for example, a superconducting layer made of a REBCO superconducting body and is a membrane made by MOCVD method, etc. RE is a rare-earth element such as Y (Yttrium), Sc (Scandium), La (Lanthanum), Ce (Cerium), Pr (Praseodymium), Nd (Neodymium), Pm (Promethium), Sm (Samarium), Eu (Europium), Gd (Gadolinium), Tb (Terbium), Dy (Dysprosium), Ho (Holmium), Er (Erbium), Tm (Thulium), Yb (Ytterbium), Lu (Lutetium), etc.

The protection layer 4 is, for example, a silver membrane made in the sputtering method, and is formed for protecting the superconducting layer 3.

The stabilization layer 5 is, for example, formed by plating with copper, and consists of an electric conductor which covers sides of the laminated body comprising the substrate 1, the middle layer 2, the superconducting layer 3 and the protection layer 4. This stabilization layer 5 is formed for releasing heat generated at limited points and for bypassing current when quenching occurs.

The layer configuration of the superconducting wire 10 is common to the first superconducting wire 11, the second superconducting wire 12 and the third superconducting wire 13 which will be explained later.

Next, a superconducting wire connection structure and a superconducting wire connection method according to the present invention will be explained.

Figure 2:
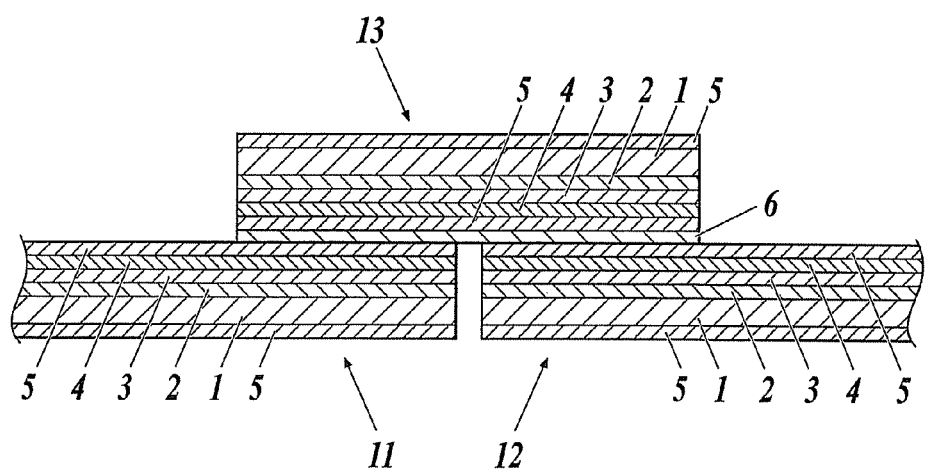
FIG. 2 This is a cross-sectional view showing a superconducting wire connection structure according to the present invention.

FIG. 2 illustrates the superconducting wire connection structure and shows, in cross section, a state where the first superconducting wire 11 and the second superconducting wire 12 are connected by the third superconducting wire 13 for connecting.

As shown in FIG. 2, ends of the first superconducting wire 11 and the second superconducting wire 12 are spaced apart from and arranged across from each other. The third superconducting wire 13 is connected to the portion where the first superconducting wire 11 and the second superconducting wire 12 are spaced apart from and arranged across from each other via a solder layer 6. Preferably, the space between the first superconducting wire 11 and the second superconducting wire 12 is approximately 1 mm to 5 mm in view of stiffness.

This third superconducting wire 13 spans and connects the first superconducting wire 11 and the second superconducting wire 12 along a longitudinal direction of the first superconducting wire 11 and the second superconducting wire 12. Preferably, the widths of the first superconducting wire 11 and the second superconducting wire 12 are the same and are substantially uniform along the longitudinal direction.

Especially, the third superconducting wire 13 is characterized by having a portion which is narrower than the first superconducting wire 11 and the second superconducting wire 12. Preferably, the width of the widest portion of the third superconducting wire 13 is the same as the widths of the first superconducting wire 11 and the second superconducting wire 12.

Figure 3:
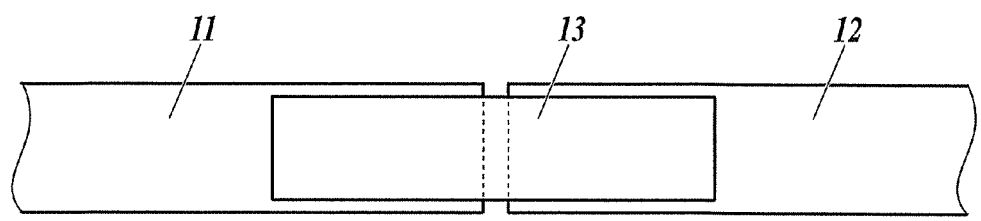
FIG. 3 This is a plan view showing the superconducting wire connection structure according to the present invention.

The third superconducting wire 13 is, for example, cut in a short length in advance as shown in FIG. 3. The third superconducting wire 13 is narrower than the first superconducting wire 11 and the second superconducting wire 12 throughout the third superconducting wire 13 along the longitudinal direction, and is substantially rectangle-shaped as seen from above.

In many cases, ends of the first superconducting wire 11 and the second superconducting wire 12 are formed after being cut at a work site for laying superconducting cables, etc. for example. However, preferably, the third superconducting wire 13 is formed, not after being cut at a work site, but after being cut in advance in a desired shape by laser cutting. Since the section cut by laser cutting is fused by heat for sticking, the superconducting layer 3 included in the third superconducting wire 13 is prevented from troubles such as peeling. It is preferable because the third superconducting wire 13 can be cut in a desired shape and in a desired size. Preferably, copper-plating processing, etc. is executed on the third superconducting wire 13 after laser cutting so that the section is covered with metal.

At this connection portion, the first superconducting wire 11 and the second superconducting wire 12 are arranged such that surfaces thereof on the side of the superconducting layer 3 are arranged across from each other.

Preferably, the melting point of the solder layer 6, which connects the first superconducting wire 11 and the second superconducting wire 12 to the third superconducting wire 13, is no more than 160 C for achieving appropriate superconductivity. Specifically, solder having the melting point of approximately 120 C is preferable (for example, a bismuth alloy, etc.).

According to such superconducting wire connection structure, the length of an edge of the surface of the third superconducting wire 13 contacting the first superconducting wire 11 and the second superconducting wire 12 via the solder layer 6 is longer than prior art. Therefore current flow concentration by the skin effect is suppressed, and current density around each end of the third superconducting wire 13 in the longitudinal direction is lowered.

By lowering the current density around each end of the third superconducting wire 13 in the longitudinal direction, generation of heat caused by current flow concentration is suppressed, and deterioration of the superconducting layer 3 is reduced.

If the first superconducting wire 11 and the second superconducting wire 12 are not spaced apart but are contacted with each other, the first superconducting wire 11, the second superconducting wire 12 and the third superconducting wire 13 contact with each other at one point. Current flow concentration occurs at this point, and heat caused by the current flow concentration makes the superconducting layer 3 deteriorate. By keeping a space between the first superconducting wire 11 and the second superconducting wire 12, heat caused by the current flow concentration is suppressed, and thereby deterioration of the superconducting layer 3 is suppressed.

Thus the third superconducting wire 13 connects the first superconducting wire 11 and the second superconducting wire 12 along a longitudinal direction of the first superconducting wire 11 and the second superconducting wire 12 at a portion where ends of the first superconducting wire 11 and the second superconducting wire 12 are spaced apart from and arranged across from each other. The third superconducting wire 13 is narrower in at least one portion than the first superconducting wire 11 and the second superconducting wire 12. This superconducting wire connection structure can suppress generation of heat caused by the current flow concentration at portions where the third superconducting wire 13 is connected to the first superconducting wire 11 and the second superconducting wire 12. Thereby deterioration of the superconducting layer 3 is reduced, and stable superconductivity is achieved.

That is to say, the superconducting wire connection structure according to the present invention is a useful technique where the first superconducting wire 11 and the second superconducting wire 12 are easily connected to the third superconducting wire 13 by soldering and which achieves stable superconductivity.

The present invention is not limited to the above embodiments.

Figure 4:
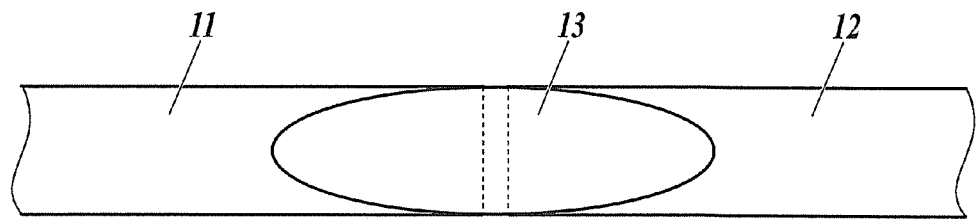
FIG. 4 This is a figure showing a modification of the superconducting wire connection structure.

For example, as shown in FIG. 4, it is also possible that the third superconducting wire 13, which is a connection superconducting wire, is widest at the center portion in the longitudinal direction thereof and narrows toward both ends from the center portion such that the third superconducting wire 13 is substantially oval-shaped as seen from above.

In the case of such third superconducting wire 13 substantially oval-shaped as seen from above, the length of an edge of the surface of the third superconducting wire 13 contacting the first superconducting wire 11 and the second superconducting wire 12 via the solder layer 6 is longer than prior art. Therefore current flow concentration by the skin effect is suppressed, and current density around each end of the third superconducting wire 13 in the longitudinal direction is lowered. Thereby generation of heat caused by current flow concentration is suppressed, and deterioration of the superconducting layer 3 is reduced.

The width of the third superconducting wire 13 substantially oval-shaped is largest at the center portion in the longitudinal direction, wherein the width of the third superconducting wire 13 is the same as each width of the first superconducting wire 11 and the second superconducting wire 12. The third superconducting wire 13 is joined such that the center portion, which is the widest portion of the third superconducting wire 13, is positioned at a place corresponding to the space between the first superconducting wire 11 and the second superconducting wire 12. Thereby the intensity of the connected portion is maintained appropriately.

Figure 5:
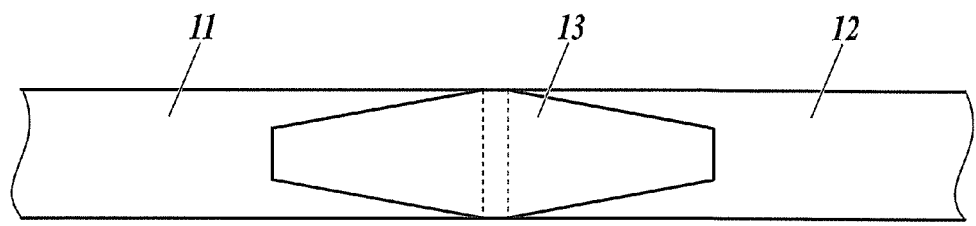
FIG. 5 This is a figure showing a modification of the superconducting wire connection structure.

As shown in FIG. 5, it is also possible that the third superconducting wire 13, which is a connection superconducting wire, is widest at the center portion in the longitudinal direction thereof and narrows toward both ends from the center portion such that the third superconducting wire 13 is substantially diamond-shaped as seen from above.

In the case of such third superconducting wire 13, which tapers toward both ends, the length of an edge of the surface of the third superconducting wire 13 contacting the first superconducting wire 11 and the second superconducting wire 12 via the solder layer 6 is longer than prior art. Therefore current flow concentration by the skin effect is suppressed, and current density around each end of the third superconducting wire 13 in the longitudinal direction is lowered. Thereby generation of heat caused by current flow concentration is suppressed, and deterioration of the superconducting layer 3 is reduced.

The width of third superconducting wire 13 substantially diamond-shaped is largest at the center portion in the longitudinal direction, wherein the width of the third superconducting wire is the same as each width of the first superconducting wire 11 and the second superconducting wire 12. The third superconducting wire 13 is joined such that the center portion, which is the widest portion of the third superconducting wire 13, is positioned at a place corresponding to the space between the first superconducting wire 11 and the second superconducting wire 12. Thereby the intensity of the connected portion is maintained appropriately.

In order to prevent peeling of this third superconducting wire 13, preferably, the substantial diamond shape of the third superconducting wire 13 is chamfered.

The superconducting wire connection method of the present invention is not limited to the method where the third superconducting wire 13 for connecting connects the two superconducting wires such as the first superconducting wire 11 and the second superconducting wire 12.

For example, there is a case where one superconducting wire 10 has a deterioration area R where, for example, superconductivity is lowered by some trouble and thereby critical current is lowered. In such case, the present invention can be applied to electric connection between the first area and the second area facing each other across the deterioration area R using the third superconducting wire 13. That is to say, the first area 10a and the second area 10b in the superconducting wire 10 spaced apart by the deterioration area R are respectively likened to the first superconducting wire and the second superconducting wire and are electrically connected using the third superconducting wire 13.

Figure 6:
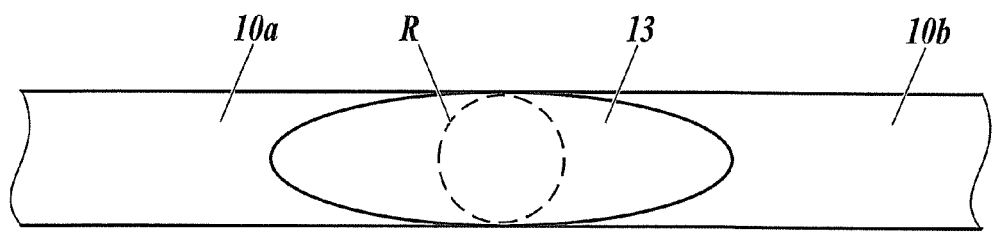
FIG. 6 This is a plan view showing another embodiment of the superconducting wire connection structure.
Figure 7:
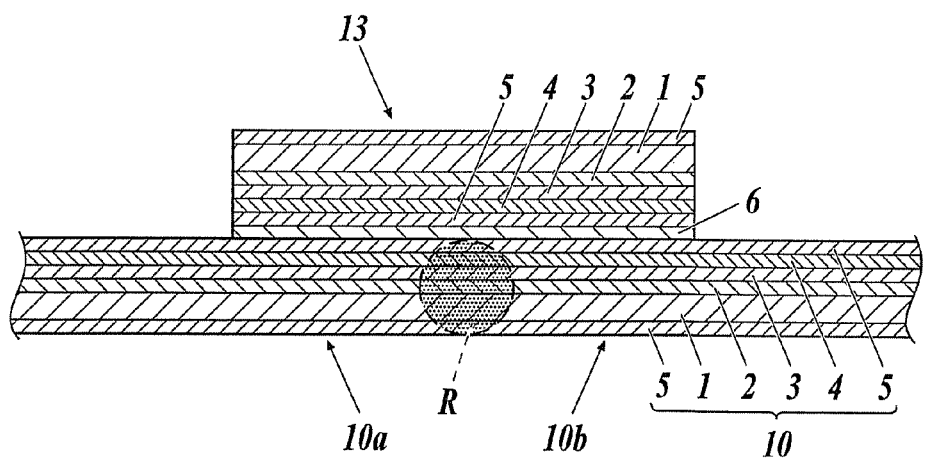
FIG. 7 This is a cross-sectional view showing the other embodiment of the superconducting wire connection structure.
Figure 8A:
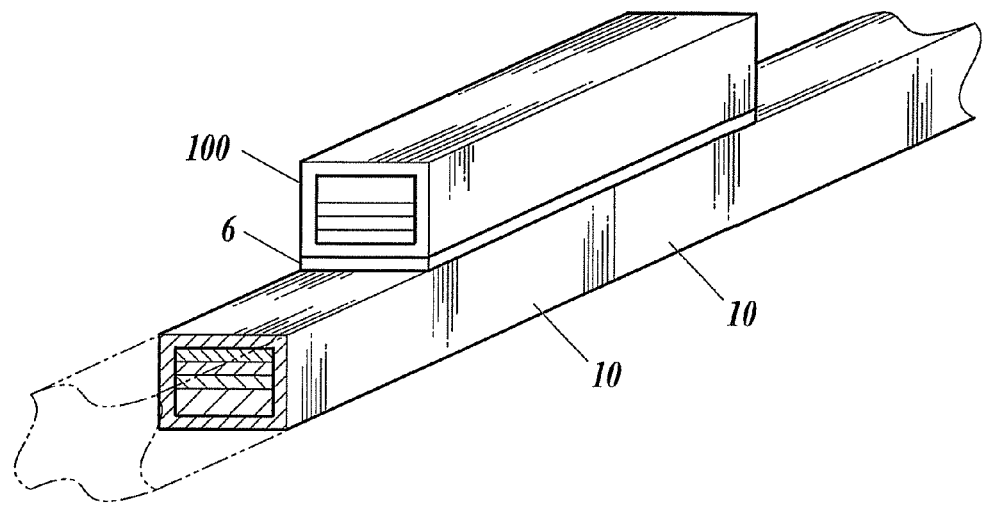
FIG. 8A This is a perspective view showing a conventional superconducting wire connection structure.
Figure 8B:
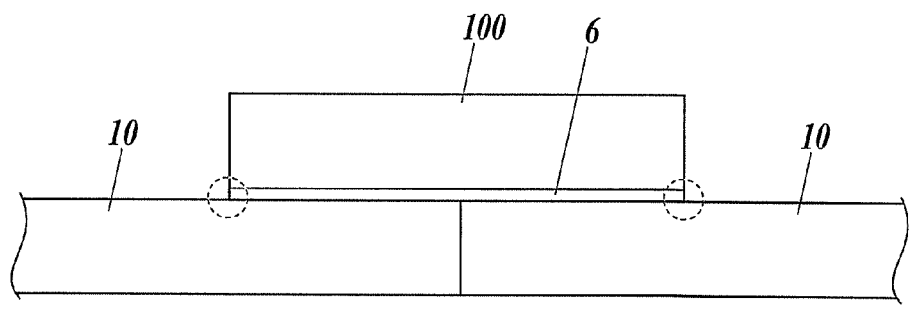
FIG. 8B This is a side view showing the conventional superconducting wire connection structure.
Figure 8C:
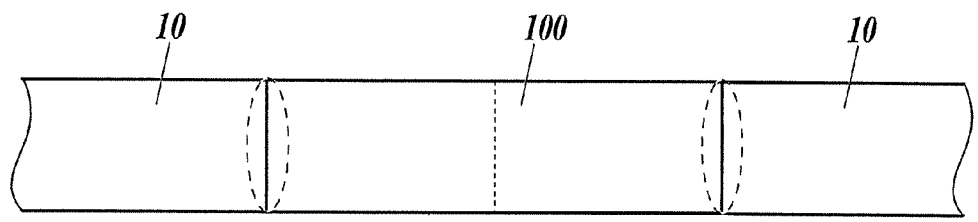
FIG. 8C This is a plan view showing the conventional superconducting wire connection structure.

For example, when the superconducting wire 10 includes the deterioration area R as shown in FIG. 6 and FIG. 7 and the first area 10a and the second area 10b are to be connected with the deterioration area R between them, the third superconducting wire 13 spans and connects the first area 10a and the second area 10b at a portion where the first area 10a and the second area 10b are arranged across from each other. The third superconducting wire 13 is narrower in at least one portion than the superconducting wire 10. In this example, the third superconducting wire 13 which is substantially oval-shaped as seen from above is joined to the superconducting wire 10 via the solder layer 6.

Thus the third superconducting wire 13 connects the first area 10a and the second area 10b in the superconducting wire 10 which are electrically separated by the deterioration area R, and thereby a superconducting wire connection structure having stable superconductivity is achieved.

In the above embodiments, the third superconducting wires 13 having substantial shapes of a rectangle, an oval and a diamond as seen from above are exemplified. However, the present invention is not limited to these and any other shapes are possible as long as the third superconducting wire 13 is narrower in at least one portion than the first superconducting wire 11 and the second superconducting wire 12.

Current density can be more effectively lowered by insulating the periphery of the third superconducting wire 13 through chemical etching for example.

It goes without saying that specific details, etc. can be changed as the occasion demands.

INDUSTRIAL APPLICABILITY

Since the present invention is configured as above, it can be applied to techniques of connecting superconducting wires as a superconducting wire connection structure, a superconducting wire connection method and a superconducting wire for connecting.

DESCRIPTION OF REFERENCE NUMERALS 1 substrate
2 middle layer
3 superconducting layer
4 protection layer
5 stabilization layer
6 solder layer
10 superconducting wire
11 first superconducting wire
12 second superconducting wire
13 third superconducting wire (connection superconducting wire)

The invention claimed is:

1. A superconducting wire connection structure, comprising:
a first superconducting wire and a second superconducting wire, ends of which are arranged across from each other; and
a third superconducting wire which is put on top surfaces of the first superconducting wire and the second superconducting wire such that the third superconducting wire spans and connects the first superconducting wire and the second superconducting wire along a longitudinal direction of the first superconducting wire and the second superconducting wire,
wherein each of the first superconducting wire, the second superconducting wire and the third superconducting wire is a tape-shaped superconducting wire which includes a substrate laminated with at least a superconductive layer in an up-and-down direction which is perpendicular to the longitudinal direction,
wherein a surface of the third superconducting wire on a side where the substrate is laminated with the superconductive layer faces surfaces of the first superconducting wire and the second superconducting wire on a side where the substrates are laminated with the superconductive layers,
wherein the third superconducting wire, as seen from above, tapers toward both ends thereof such that each of the both ends is arranged within both edges of the first superconducting wire and the second superconducting wire.

2. The superconducting wire connection structure according to claim 1, wherein the first superconducting wire and the second superconducting wire are spaced apart from and arranged across from each other.

3. The superconducting wire connection structure according to claim 1, wherein the third superconducting wire is widest at a portion corresponding to a space between the first superconducting wire and the second superconducting wire.

4. The superconducting wire connection structure according to claim 1, wherein the third superconducting wire is substantially oval as seen from above.

5. The superconducting wire connection structure according to claim 1, wherein the third superconducting wire is substantially rhombic as seen from above.

6. The superconducting wire connection structure according to claim 1, wherein an end of the first superconducting wire is arranged across from another end of the second superconducting wire, and wherein the end of the first superconducting wire is spaced apart from the other end of the second superconducting wire by 1 mm to 5 mm.

7. A superconducting wire connection method for connecting tape-shaped superconducting wires each of which includes a substrate laminated with at least a superconductive layer, comprising:
  spanning and connecting a first superconducting wire and a second superconducting wire by a third superconducting wire along a longitudinal direction of the first superconducting wire and the second superconducting wire at a portion where ends of the first superconducting wire and the second superconducting wire are spaced apart from and arranged across from each other, the third superconducting wire being put on top surfaces of the first superconducting wire and the second superconducting wire, and the third superconducting wire, as seen from above, tapering toward both ends thereof such that each of the both ends is arranged within both edges of the first superconducting wire and the second superconducting wire.

8. A superconducting wire connection method, comprising:
  spanning and connecting a first area and a second area of a superconducting wire facing each other across a deterioration area by a connection superconducting wire at a portion where the first area and the second area are arranged across from each other, the deterioration area being electrically deteriorated, the connection superconducting wire being put on top surfaces of the first area and the second area, and the connection superconducting wire, as seen from above, tapering toward both ends thereof such that each of the both ends is arranged within both edges of the superconducting wire.

9. A connection superconducting wire for electrically connecting a first superconducting wire and a second superconducting wire, ends of which are arranged across from each other, comprising:
  a center portion in a longitudinal direction of the connection superconducting wire which is a widest portion of the connection superconducting wire,
  wherein the connection superconducting wire is put on top surfaces of the first superconducting wire and the second superconducting wire, and
  wherein the connection superconducting wire, as seen from above, tapers toward both ends thereof such that each of the both ends is arranged within both edges of the first superconducting wire and the second superconducting wire.

10. The connection superconducting wire according to claim 9, wherein the connection superconducting wire has a laminated structure including a superconducting layer, sides of which are covered with an electric conductor.

* * * * *